(12) United States Patent
Yang

(10) Patent No.: US 6,590,456 B2
(45) Date of Patent: Jul. 8, 2003

(54) ACTIVE CASCODE AMPLIFIER WITH AN AMPLITUDE LIMITER

(75) Inventor: Wenhua Yang, North Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/907,329

(22) Filed: Jul. 17, 2001

(65) Prior Publication Data

US 2003/0016086 A1 Jan. 23, 2003

(51) Int. Cl.$^7$ ................................................ H03F 1/22
(52) U.S. Cl. ..................... 330/311; 330/253; 327/328
(58) Field of Search ................................ 330/311, 253, 330/257, 277, 260; 327/309, 325, 328, 327, 180

(56) References Cited

U.S. PATENT DOCUMENTS

| 4,818,893 A | | 4/1989 | Domnitz ..................... 307/254 |
|---|---|---|---|
| 5,039,954 A | | 8/1991 | Bult et al. .................. 330/277 |
| 5,789,981 A | * | 8/1998 | Singer et al. ............... 330/311 |
| 5,847,607 A | | 12/1998 | Lewicki et al. ............. 330/258 |
| 6,177,838 B1 | * | 1/2001 | Chiu ........................... 330/311 |
| 6,294,941 B1 | * | 9/2001 | Yokosawa ................... 327/309 |
| 6,377,120 B1 | * | 4/2002 | Hsieh ......................... 330/253 |

OTHER PUBLICATIONS

Pan, H., et al., "A 3.3–V 12–b 50–MS/s A/D Converter in 0.6–μm CMOS With Over 80–dB SFDR," IEEE, Journal of Solid State Circuits, vol. 35, No. 12, pp. 1769–1780.

* cited by examiner

Primary Examiner—Robert Pascal
Assistant Examiner—Khanh Van Nguyen
(74) Attorney, Agent, or Firm—Bromberg & Sustein LLP

(57) ABSTRACT

An active cascode amplifier circuit which includes an active cascode amplifier and an amplitude limiter. The active cascode amplifier includes an input stage, an output stage and an auxiliary amplifier and receives in a voltage input signal and outputs a voltage output signal wherein the cascode amplifier amplifies the input voltage signal. The auxiliary amplifier is provided within the circuit to increase the gain of the cascode amplifier and has an associated output. When the input stage shuts off, due to a decrease in the input voltage signal, the amplitude limiter becomes active and holds the voltage at the output of the auxiliary amplifier to a preset voltage in order to decrease the recovery time for turning the output stage on when the input voltage increases and turns the input stage on.

20 Claims, 11 Drawing Sheets

ACTIVE CASCODE AMPLIFIER WITH AN AMPLITUDE LIMITER

TECHNICAL FIELD

The present invention relates to the electrical arts and more specifically to active cascode amplifier circuits.

BACKGROUND ART

FIG. 1 is a prior art active cascode amplifier as shown and described in U.S. Pat. No. 5,039,054 which is incorporated herein by reference in its entirety. Active cascode amplifiers have both an output stage and an input stage. In FIG. 1 the input stage is represented by a Metal-Oxide-Semiconductor-Field-Effect-Transistor ("MOSFET") transistor Q1 and the output stage is represented by another MOSFET transistor Q2. Attached to the gate of the output stage, MOSFET Q2, is the output of an auxiliary amplifier. The auxiliary amplifier, which in FIG. 1 is an operational amplifier has a bias voltage present at the positive input and the negative input is electrically coupled to node X providing a feedback loop. The operational amplifier increases the output resistance of the active cascode amplifier. Assuming a constant current source, the increased output resistance increases the voltage gain.

The active cascode amplifier operates in the following manner. When the input voltage signal, Vin drops below the threshold voltage of the MOSFET, Q1 shuts off. In response, the voltage at node X begins to increase, which in turn decreases the differential voltage between the positive and negative terminals of the operational amplifier. As a result, the output voltage at the control terminal (gate) of the output stage transistor Q2 decreases eventually shutting off the output stage and causing the active cascode amplifier to slew. Given enough time, the operational amplifier will saturate toward a voltage which is close to ground. When the output voltage of the operational amplifier drops to such a voltage that the gate to source voltage is less than that of the MOSFET's threshold voltage for turning on, the output stage transistor Q2 shuts off. The output voltage of the operational amplifier continues to fall until the voltage approaches ground. Thus, the gate to source voltage falls well below the threshold voltage. When Vin then increases and goes above the threshold voltage for the transistor, such that Q1 turns on, the auxiliary amplifier requires a period of time, referred to as a "recovery time period" for the voltage at the gate of Q2 to increase such that Q2 turns on. The recovery time period is shown in the graph of FIG. 2. This recovery time poses problems for devices which require quick circuit operation. The length of the recovery time is proportional to the difference between the gate voltage when Q2 is operational and the voltage at the gate when Q2 is off.

One solution to this problem known in the prior art is the inclusion of a trickle current source positioned at node X as shown in FIG. 3. The trickle current source provides a trickle current and thus a current flow path even when the input stage MOSFET Q1 is off. This trickle current causes the output stage transistor Q2 to remain in a partially on state. Since Q2 is in a partially on state, the recovery time is decreased as shown in the graph of FIG. 4 as compared to the graph of FIG. 2. One drawback of this configuration is that the trickle current source is constantly active drawing power and the power drain provides no increase to the speed of the amplifier.

SUMMARY OF THE INVENTION

In a first embodiment of the invention there is provided an active cascode amplifier circuit which includes an active cascode amplifier and an amplitude limiter. The active cascode amplifier includes an input stage, an output stage and an auxiliary amplifier and receives in a voltage input signal and outputs a voltage output signal wherein the active cascode amplifier amplifies the input voltage signal. The auxiliary amplifier is provided within the circuit to increase the gain of the cascode amplifier and has an associated output.

When the input stage shuts off, due to a decrease in the input voltage signal, the auxiliary amplifier's output voltage falls and the amplitude limiter becomes active and holds the voltage at the output of the auxiliary amplifier to a preset voltage in order to decrease the recovery time for turning the output stage on when the input voltage increases and turns the input stage on.

The voltage at the output of the auxiliary amplifier provides a voltage to a control terminal of the output stage. When the output voltage of the auxiliary amplifier falls below a threshold voltage for the output stage, the output stage shuts off. The voltage at the control terminal would continue to fall, but for the amplitude limiter circuit. Thus, by preventing the voltage at the output of the auxiliary amplifier from falling below a preset limit, the recovery time to pull up the voltage at the control terminal and to turn the output stage on is decreased when the input stage transitions from an off state to an on state.

The amplitude limiter is a circuit which may be formed with circuitry including but not limited to a diode, a MOSFET, a JFET, or a bipolar transistor.

In one embodiment, the active cascode amplifier operates in a singe ended mode. In another embodiment, the active cascode amplifier operates in a differential mode. In further embodiments, the active cascode amplifier may be a folded active cascode amplifier which operates in a single ended or a differential mode.

The active cascode amplifier may be formed from any of a number of electrical components including but not limited to MOSFETs, JFETs, bipolar transistors, diodes and any combination thereof.

When the active cascode amplifier circuit is implemented in which the input and the output are provided as differential signals, a plurality of amplitude limiters are provided in the active cascode amplifier circuit. Each of the amplitude limiters operate in much the same way as for the single ended mode, in which the amplitude limiter holds the voltage level at the output of the auxiliary amplifier and does not allow the voltage to fall.

In a further embodiment the amplitude limiter becomes active when the output stage begins to shut off.

BRIEF DESCRIPTION OF THE DRAWINGS

The foregoing features of the invention will be more readily understood by reference to the following detailed description, taken with reference to the accompanying drawings, in which:

FIG. 2 is a graph of the voltage at the output of the auxiliary amplifier of FIG. 1 as MOSFET Q1 is turned off and on;

FIG. 4 is a graph of the voltage at the output of the auxiliary amplifier of FIG. 3 as MOSFET Q1 is turned off and on;

DETAILED DESCRIPTION OF SPECIFIC EMBODIMENTS

Definitions. As used in this description and the accompanying claims, the following terms shall have the meanings indicated, unless the context otherwise requires:

An active cascode amplifier is a cascode amplifier circuit having an auxiliary amplifier for the purpose of increasing the overall voltage gain of the circuit.

Figure 1:
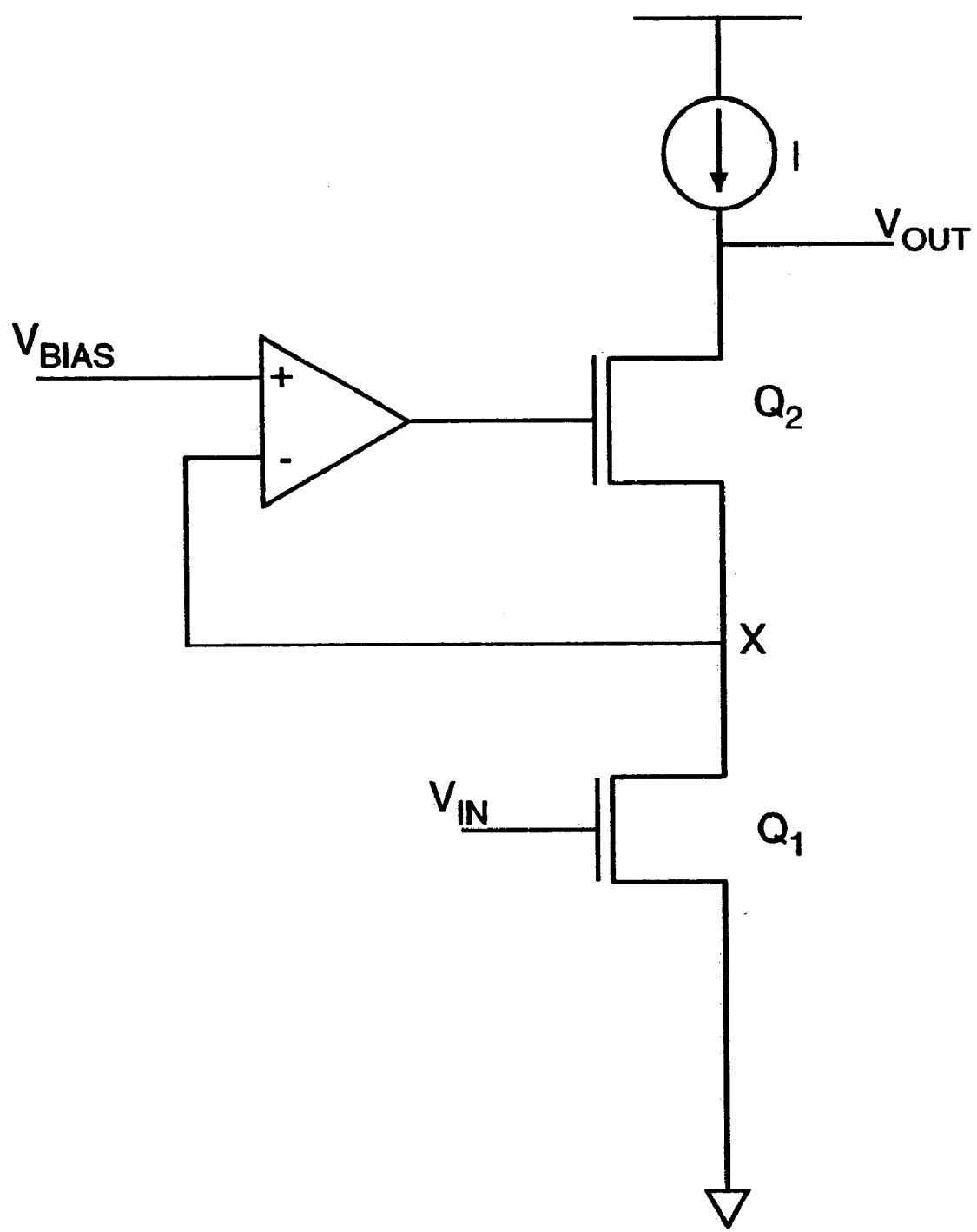
FIG. 1 is a prior art active cascode circuit.
Figure 2:
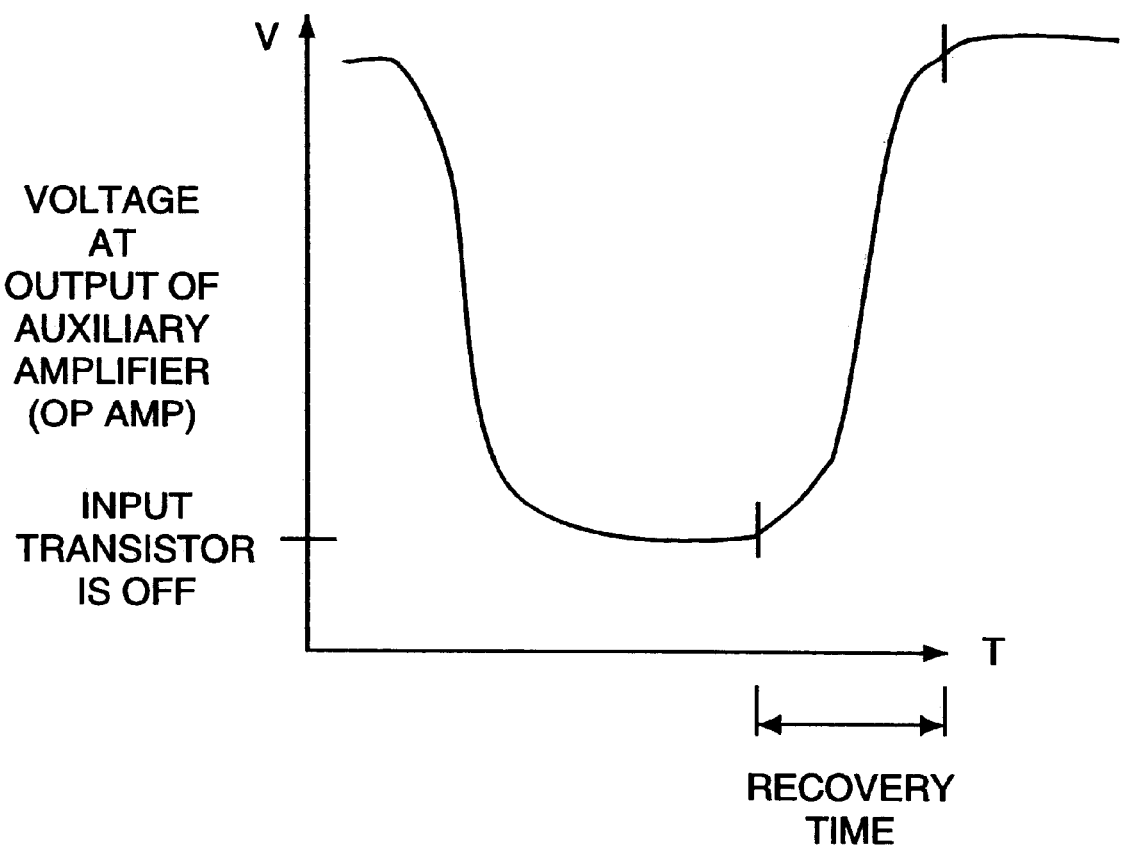
Figure 3:
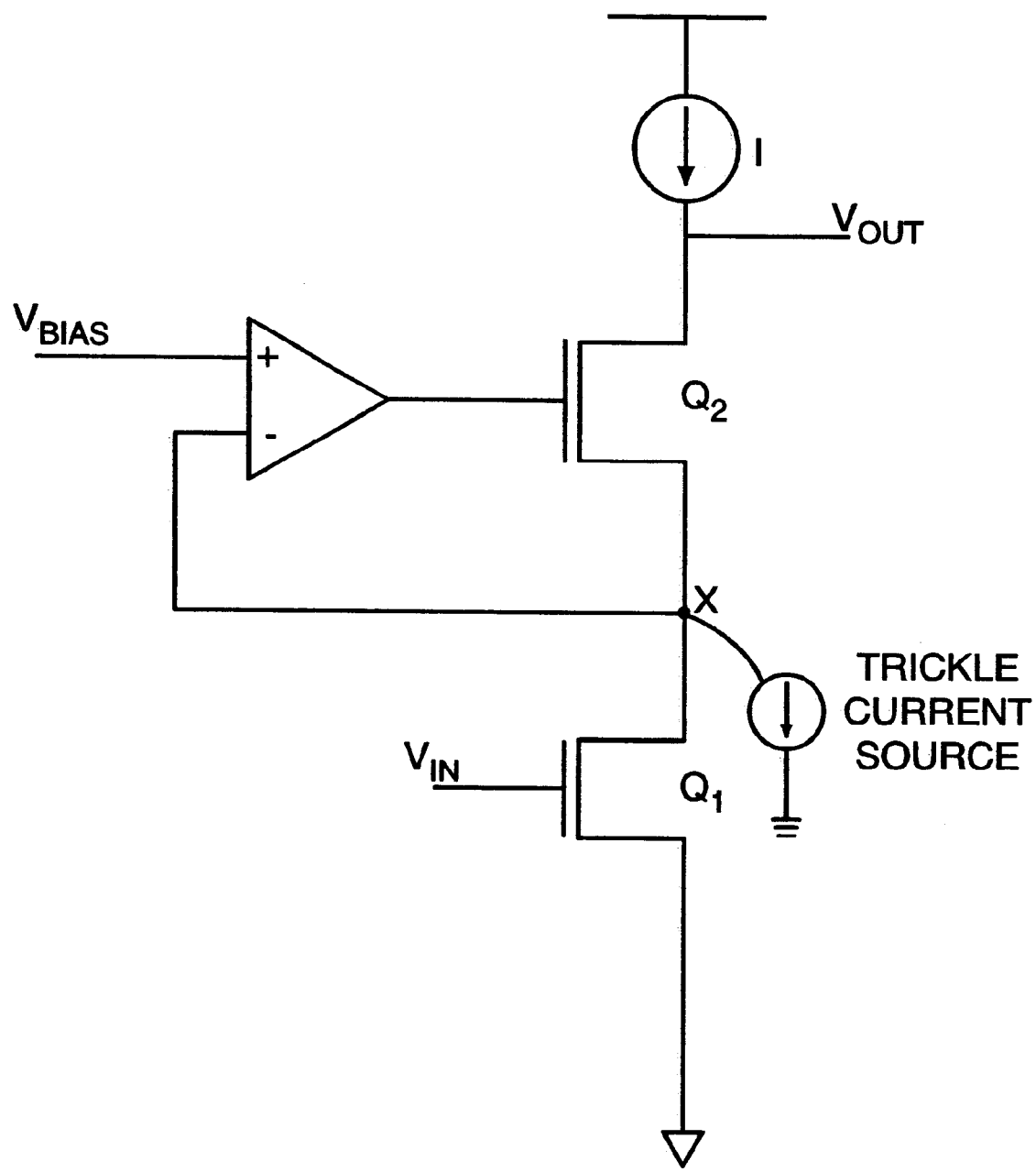
FIG. 3 is a prior art active cascode circuit with added current sources.
Figure 4:
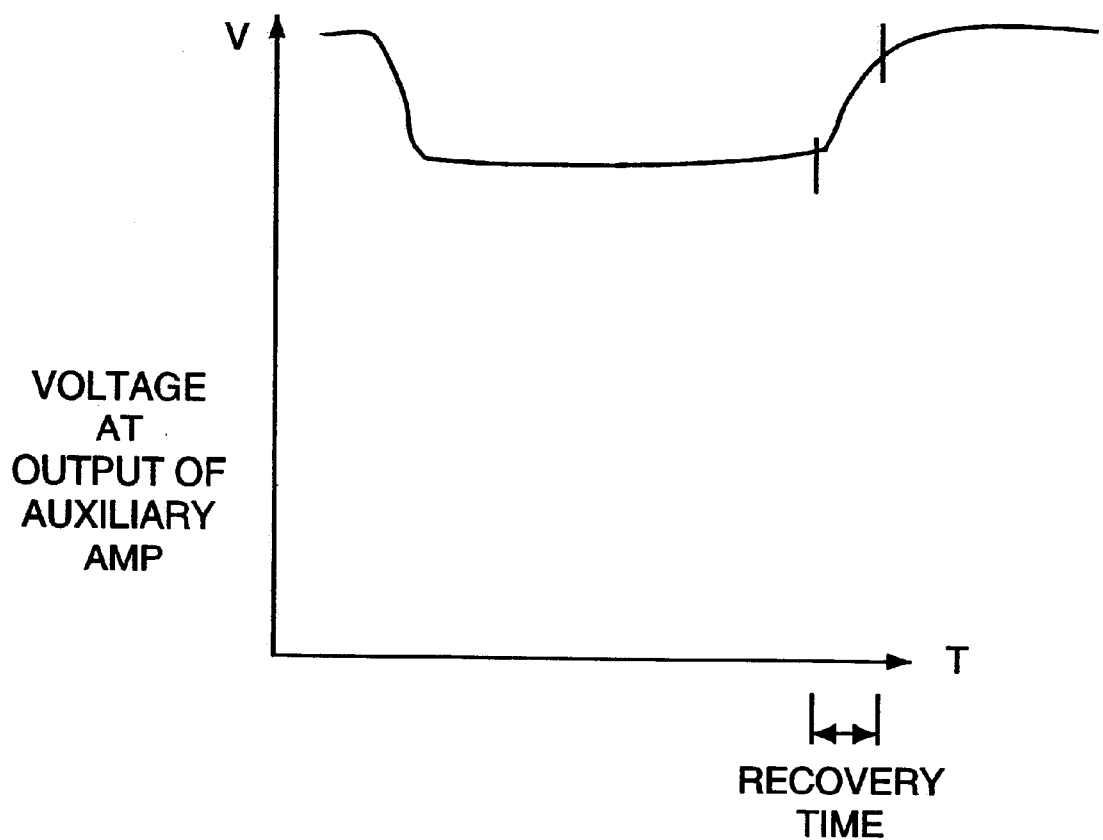
Figure 5:
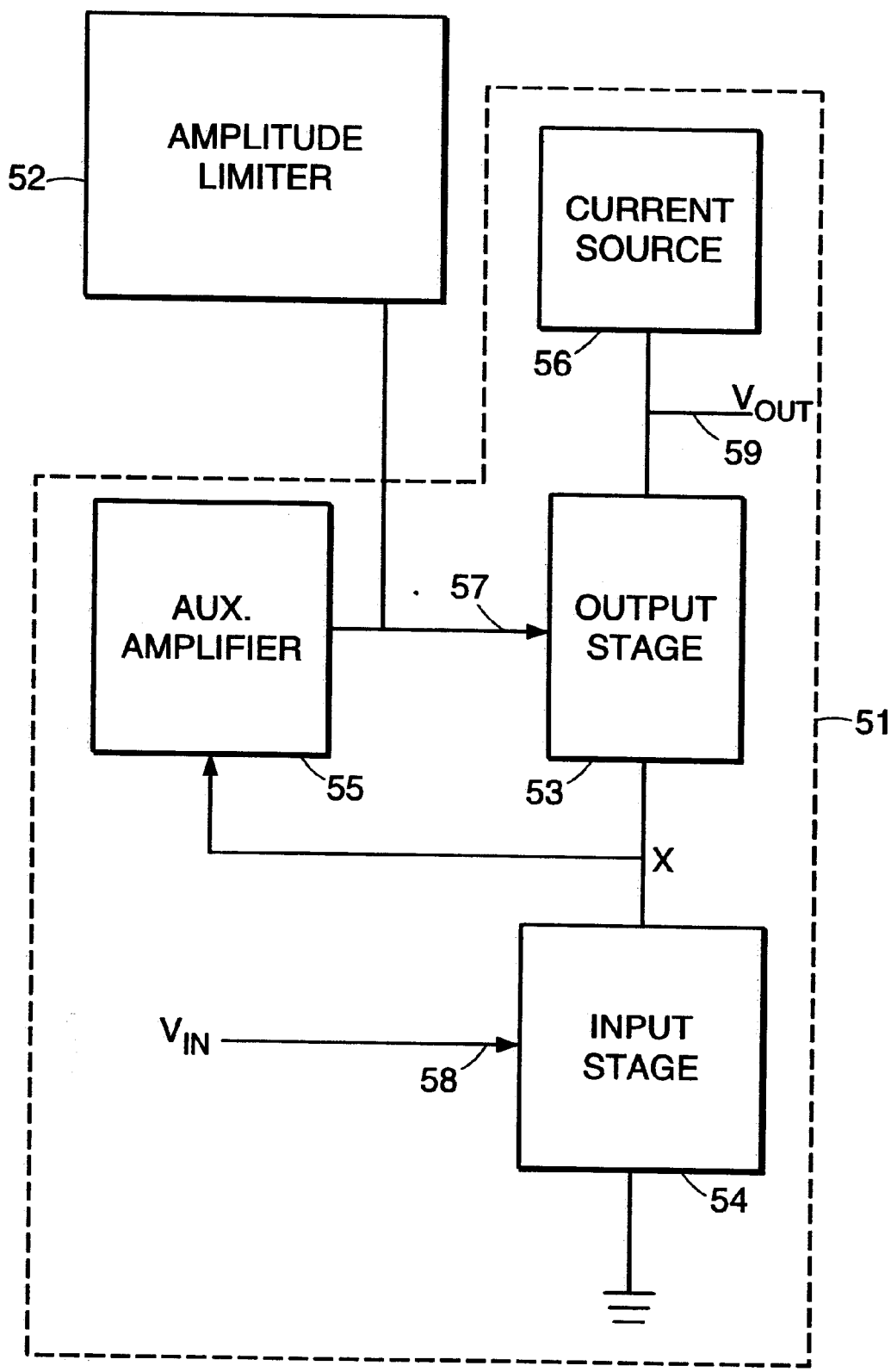
FIG. 5 is an active cascode amplifier circuit with an amplitude limiter shown with module blocks.

FIG. 5 is a block diagram showing one embodiment of the present invention wherein an amplitude limiter module 52 is added to an active cascode amplifier 51. The active cascode amplifier has at least an output stage 53, an input stage 54, an auxiliary amplifier 55 and a current source 56 all being electrically coupled. A voltage signal Vin is fed into the input 58 of the input stage and a voltage Vout is sampled at a point 59 between the output stage 57 and the current source 56. The current source 56 is electrically coupled to the output stage 53 and sets a bias level for the input stage and the output stage. The auxiliary amplifier 55 is located in a feedback loop between node X which is located between the input and output stages 54, 53 and the input 57 of the output stage 53. The amplitude limiter 52 is electrically coupled to the auxiliary amplifier 55 and to the output stage 57 of the active cascode amplifier 51 and provides a means for setting an amplitude threshold which in response to the active cascode amplifier slewing, prevents the voltage at node X from falling to a voltage state well below the voltage which is necessary to turn the output stage 53 off.

Figure 6:
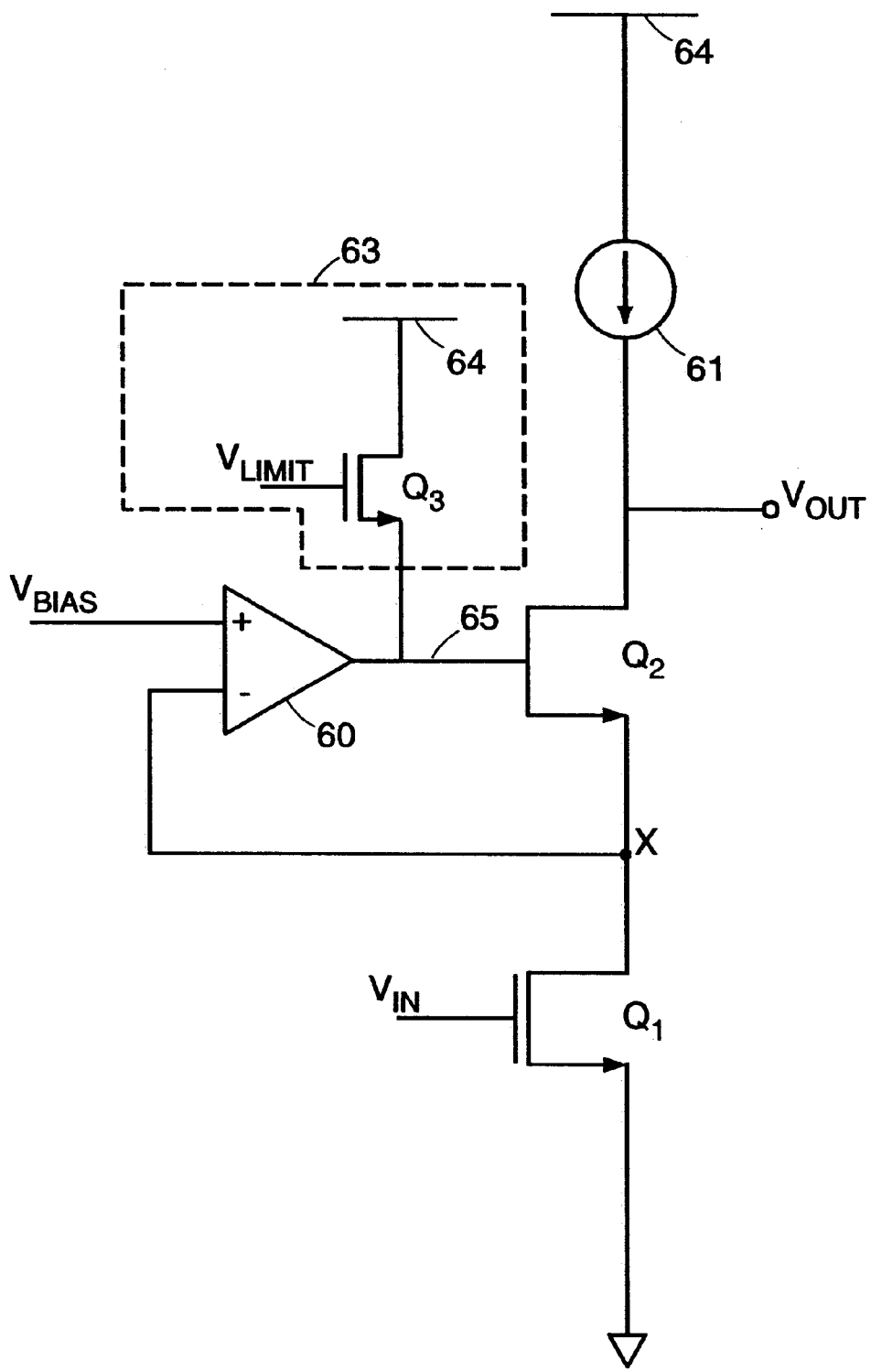
FIG. 6 is the active cascode amplifier circuit with an amplitude limiter of FIG. 5 implemented with MOSFETs.

FIG. 6 represents the modules of FIG. 5 with circuit elements. The input stage in this example is formed with a single MOSFET transistor Q1. The input stage receives Vin into the control terminal of the MOSFET Q1. Similar to the input stage, the output stage is formed with a single MOSFET Q2. The auxiliary amplifier module is implemented with a differential operational amplifier circuit 60. Attached to the output stage is a current supply which in this figure is represented by an ideal current source 61 and which is electrically coupled to a power supply 64. The current source 61 biases the output stage MOSFET Q2 and the input stage MOSFET Q1 to the current produced by the current source. It should be understood by those of ordinary skill in the art that an active cascode amplifier may be formed with other electrical components and additional circuitry without deviating from the spirit of the present invention for reducing the recovery time of the output stage to turn on when the input stage turns from an off state to an on state.

Figure 6A:
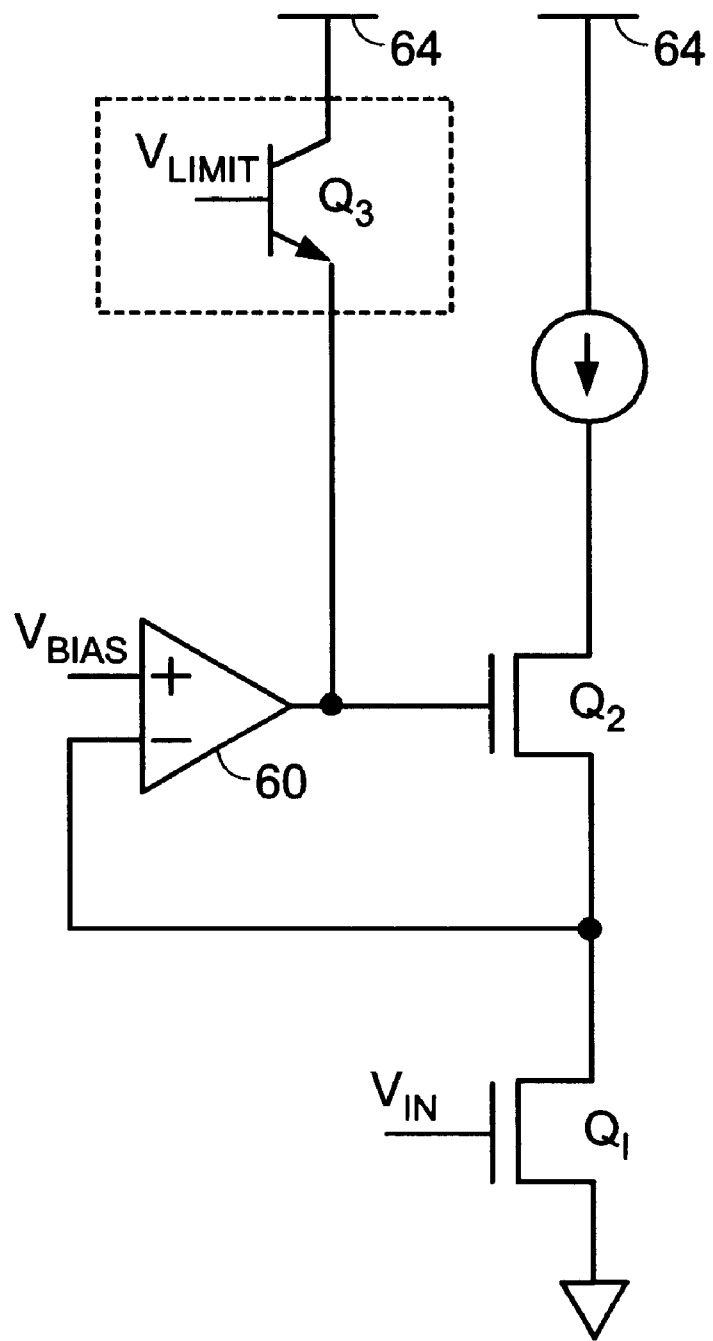
FIG. 6A is the active cascade amplifier circuit with an amplitude limiter of FIG. 5 implemented with a bipolar transistor.

In addition to the active cascode amplifier, the circuit includes an amplitude limiter 63 which becomes active either when a predetermined voltage is reached at the output 65 of the operational amplifier as shown or when the output stage shuts off. In the present embodiment the amplitude limiter 63 includes a MOSFET Q3 which is biased at its control terminal by a biasing voltage, $V_{Limit}$. It should be understood by those of ordinary skill in the art that the amplitude limiter may be implement with any number of electrical components including, but not limited to, a junction field-effect-transistor (JFET), a bipolar transistor (as shown in FIG. 6A), or a diode for example. Attached to the drain of the amplitude limiter MOSFET Q3 is a power supply 64. As stated above, the voltage at the output 65 of the operational amplifier 60 will begin to fall when the input stage transistor Q1 shuts off. This causes the voltage at node X to increase, which decreases the differential voltage between the input terminals of the operational amplifier thereby reducing the output voltage at output 65 until it reaches the predetermined voltage. In this embodiment the amplitude limiter MOSFET Q3 will turn on as the output of the operational amplifier dips below $V_{Limit}$ minus the threshold voltage of the amplitude limiter MOSFET Q3. The output voltage of the operational amplifier 60 will then be held to approximately $V_{Limit}$ minus the MOSFET threshold voltage and will not fall lower as would an active cascade circuit which does not employ an amplitude limiter. It should be understood by those of ordinary skill in the art that the voltage at which the amplitude limiter clamps will be less than $V_{Limit}$ minus the MOSFET threshold voltage because the MOSFET is not ideal.

The settable value for, $V_{Limit}$, provides a mechanism for setting the voltage level which the output voltage at output 65 will not fall below. By holding the voltage at this level and preventing the voltage from falling any further, the recovery time which is required for the operational amplifier to move to a small signal mode and to turn on the output stage transistor Q2 is decreased since the voltage at the output 65 of the operational amplifier does not need to be pulled back up as far. An advantage of this amplitude limiter is that the circuit only draws power when the output of the operational amplifier falls below a preset threshold which is a small portion of the operational time for the active cascade amplifier whereas previous solutions continually consumed power.

In another embodiment, the amplitude limiter becomes active, whenever the output stage shuts off. In such an embodiment the signal from the output stage, either the voltage or the current, is sensed and when the output signal causes the output stage to shut off the amplitude limiter becomes active.

Figure 7:
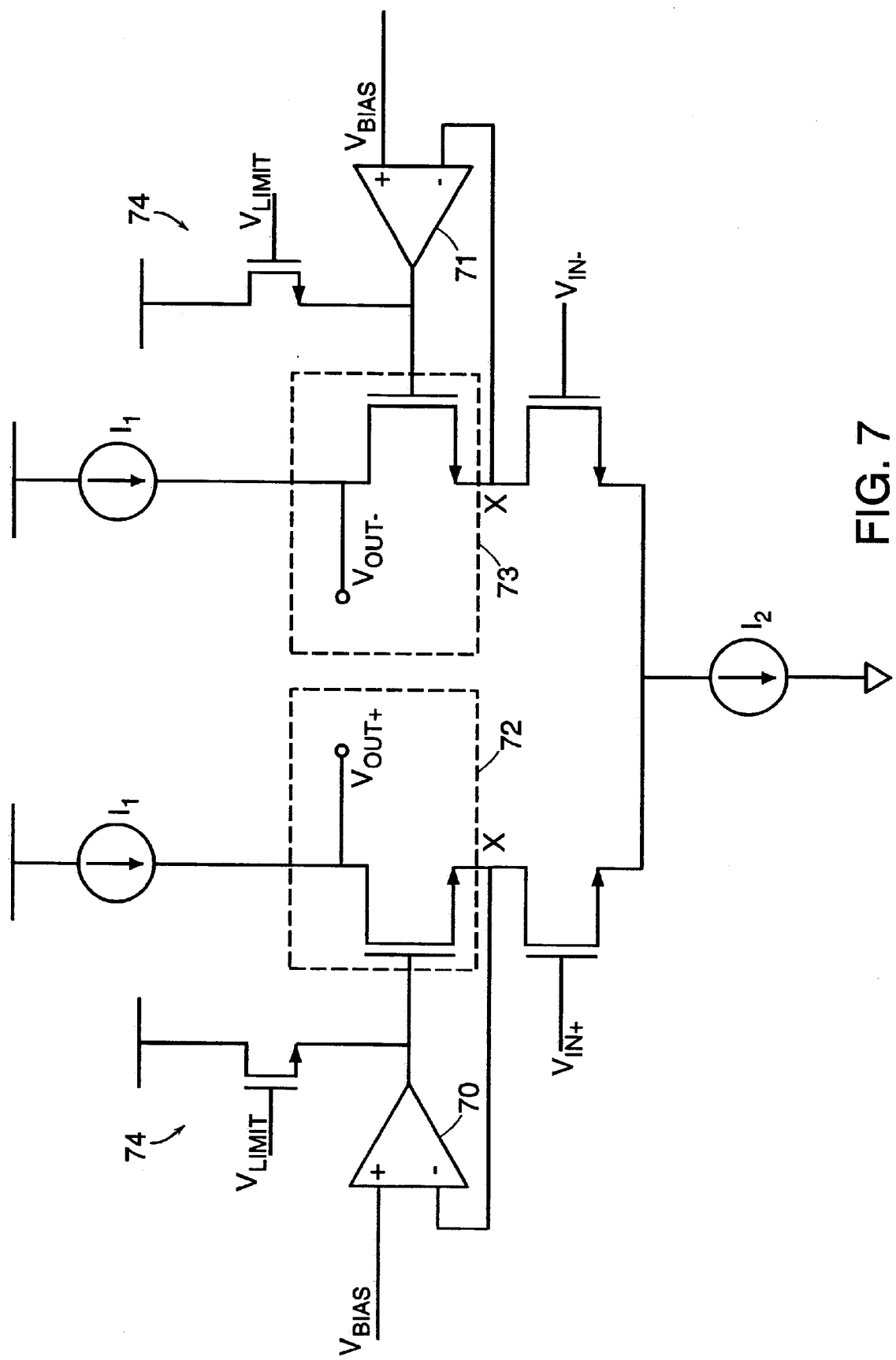
FIG. 7 is an active cascode amplifier circuit with an amplitude limiter operating in a differential mode.
Figure 7A:
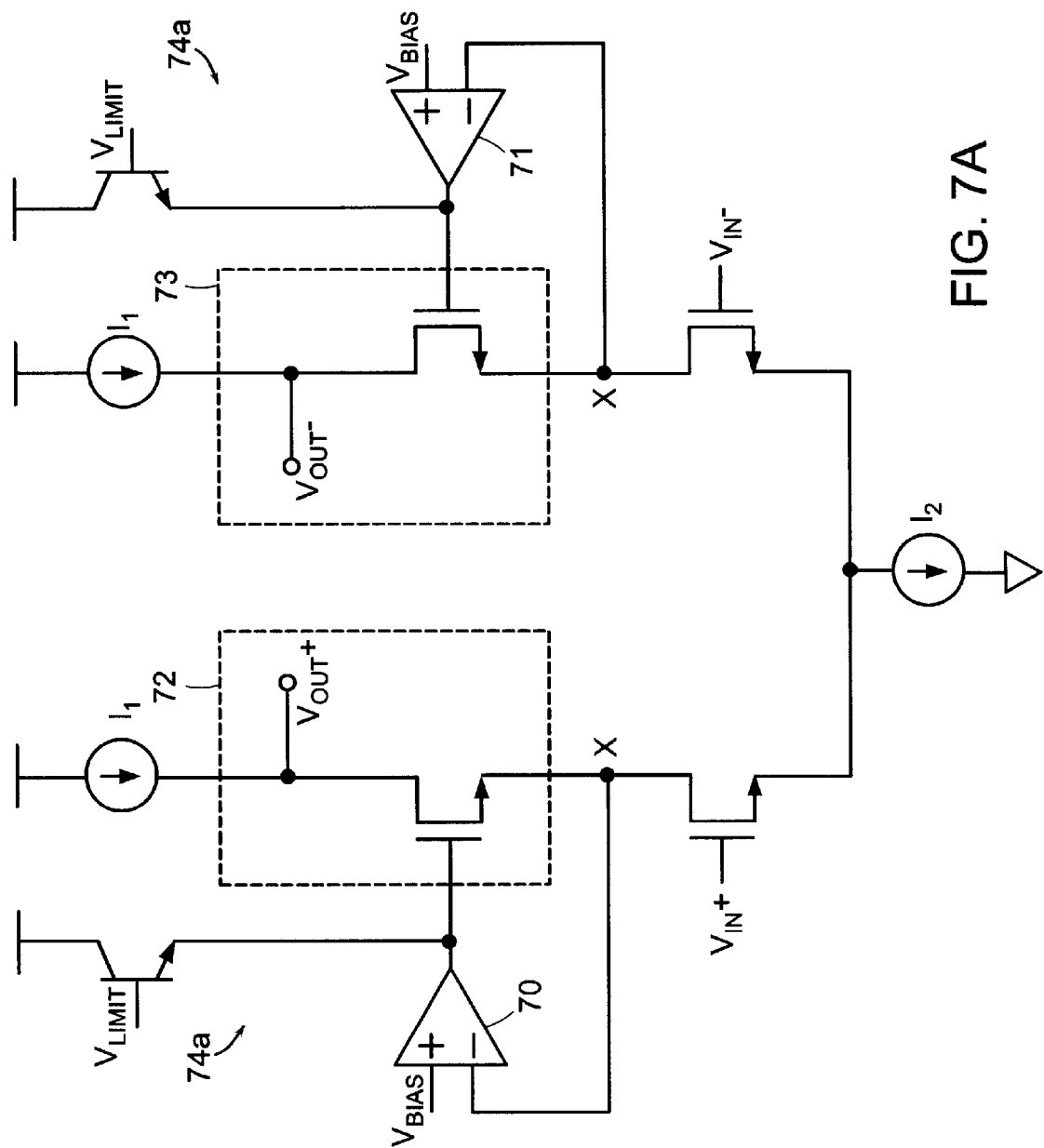
FIG. 7A is an active cascode amplifier circuit with an amplitude limiter including a bipolar transistor wherein the active cascade amplifier is operating in a differential mode.

The amplitude limiter may be employed in various active cascode circuits. For example, an active cascode circuit which operates in a differential mode as opposed to a single ended mode is shown in FIG. 7. The amplitude limiter is electrically coupled between each auxiliary amplifier 70, 71 for each end of the differential circuit and the positive and negative output stages respectively 72, 73. The amplitude limiter, as shown, operates in much the same way as described above; limiting the output voltage from falling below a threshold voltage which is determined by setting $V_{Limit}$ for each of the MOSFETs 74 of the amplitude limiters. The amplitude limiter may also be implemented with bipolar transistors 74a as shown in FIG. 7A.

Figure 8:
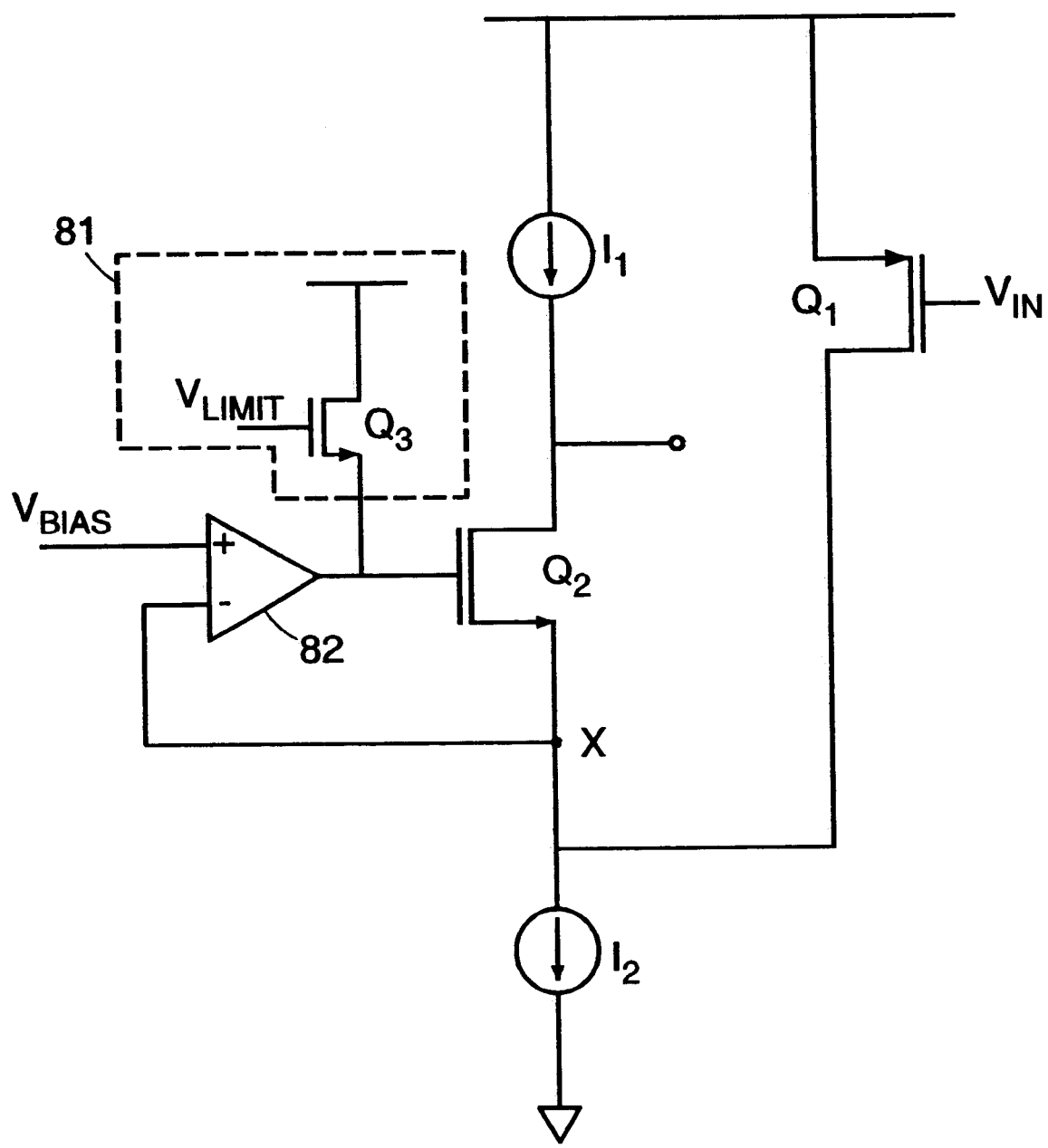
FIG. 8 is a folded active cascode circuit employing an amplitude limiter operating in a single ended mode.

In another embodiment the amplitude limiter is employed with an active folded cascode circuit operating in single ended mode as shown in FIG. 8. In this embodiment, when Vin begins to drops, the input transistor Q1 which is a P-MOS transistor in this embodiment turns on harder, which causes the voltage at the folding node X to increase. This decreases the operational amplifier's output. When the output voltage of the operational amplifier falls below the threshold voltage beyond $V_{Limit}$ ($V_{Limit}-V_{output}>V_{threshold}$), the amplitude limiter 81 becomes active and locks the output voltage, so that the output voltage does not continue to fall. When Vin begins to increase, the voltage at node X begins to fall and the output voltage of the operational amplifier 82 increases. Since the voltage at the control terminal of the output stage transistor Q2 was locked and not let to fall, the recovery time period for the operational amplifier to return to the small signal mode of operation is decreased.

Figure 9:
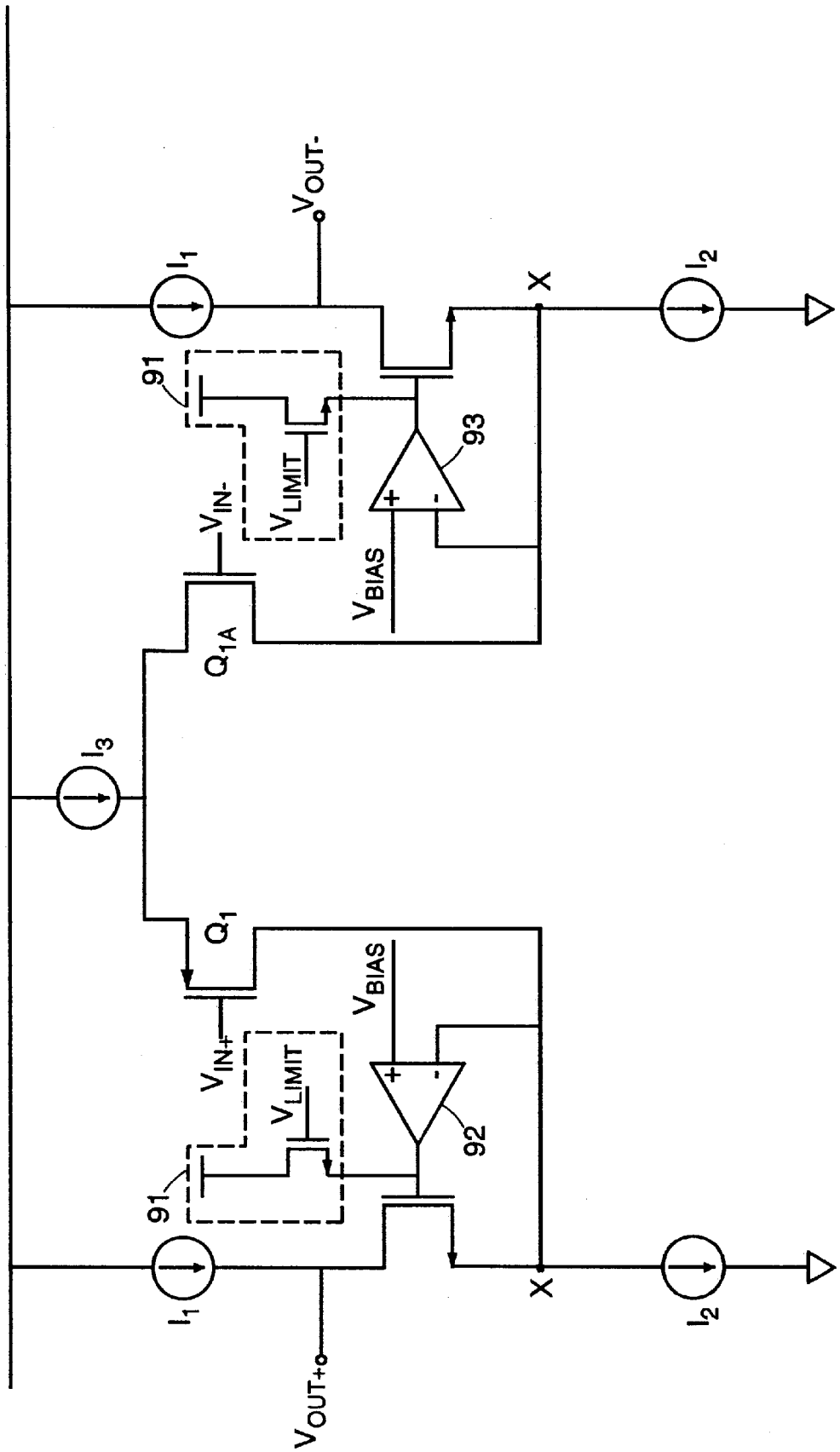
FIG. 9 is a folded active cascode circuit employing an amplitude limiter operating in a differential mode.

FIG. 9 is a differential version of the folded active cascode circuit. Compared to a regular cascode amplifier circuit the folded differential active cascode circuit provides a greater input common mode range. The amplitude limiter 91 is provided at the output of each auxiliary amplifier 92, 93 which is an operational amplifier in the shown embodiment. As with the active folded cascoded amplifier circuit, the amplitude limiter circuit works to lock the voltage at the predetermined voltage ($V_{threshold} < V_{Limit} - V_{threshold}$) as the input voltage Vin+(or Vin−) begins to decrease causing the input stage P-MOS transistor (of either the positive or negative side of the differential amplifier) Q1 or Q1A, to turn on harder, increasing the current which flow across the input stage transistor, thereby causing the folded cascode amplifiers to begin to slew. It should be understood by those of ordinary skill in the art that the predetermined voltage as defined above ($V_{threshold} < V_{Limit} - V_{output}$) was described solely for a MOSFET circuit. The predetermined voltage would be calculated in a similar manner for other types of electrical components which are used in the amplitude limiter, but would be based upon the physical properties of the individual electrical devices.

Although various exemplary embodiments of the invention have been disclosed, it should be apparent to those skilled in the art that various changes and modifications can be made which will achieve some of the advantages of the invention without departing from the true scope of the invention. These and other obvious modifications are intended to be covered by the appended claims.

What is claimed is:

1. An active cascode amplifier circuit comprising:
   an active cascode amplifier having an auxiliary amplifier, the auxiliary amplifier having an associated output;
   an amplitude limiter electrically coupled to the output of the auxiliary amplifier becoming active when the output of the auxiliary amplifier reaches a preset voltage.

2. An active cascode amplifier circuit according to claim 1, wherein the amplitude limiter includes a diode.

3. An active cascode amplifier circuit according to claim 1, wherein the amplitude limiter includes a JFET.

4. An active cascode amplifier circuit according to claim 1, wherein the amplitude limiter includes a MOSFET.

5. An active cascode amplifier circuit according to claim 1, wherein the amplitude limiter includes a bipolar transistor.

6. An active cascode amplifier circuit according to claim 1, wherein the active cascode amplifier comprises:
   an input stage for receiving an input signal; and
   an output stage having a control terminal;
   wherein the input of the auxiliary amplifier is coupled between the input stage and the output stage and the output of the auxiliary amplifier is coupled to the control terminal of the output stage.

7. An active cascode amplifier circuit according to claim 6, wherein the input stage is a transistor having a control terminal which receives the input signal.

8. An active cascode amplifier circuit according to claim 7, wherein the output stage is a transistor;
   the active cascode amplifier further having a current source which sets a bias level for the input stage and the output stage.

9. The active cascode amplifier circuit according to claim 1, wherein the active cascode amplifier is a folded active cascode amplifier.

10. A differential active cascode amplifier circuit comprising:
    a differential active cascode amplifier having a pair of auxiliary amplifiers, the auxiliary amplifiers each having an associated output;
    a pair of amplitude limiters, each amplitude limiter electrically coupled to the output of a respective auxiliary amplifier, the amplitude limiter becoming active when the output of the respective auxiliary amplifier reaches a preset voltage.

11. A differential active cascode amplifier circuit according to claim 10, wherein each amplitude limiter includes a JFET.

12. A differential active cascode amplifier circuit according to claim 10, wherein each amplitude limiter includes a MOSFET.

13. A differential active cascode amplifier circuit according to claim 10, wherein each amplitude limiter includes a bipolar transistor.

14. A differential active cascode amplifier circuit according to claim 10, wherein each amplitude limiter includes a diode.

15. A differential active cascode amplifier circuit according to claim 10, wherein the differential active cascode amplifier comprises:
    a pair of input stages for receiving a differential input signal;
    a pair of output stages each having a control terminal;
    wherein each input stage is associated with an output stage;
    wherein the input of each auxiliary amplifier is coupled between an input stage and the associated output stage and the output of each auxiliary amplifier is coupled to the control terminal of the associated output stage.

16. A differential active cascode amplifier circuit according to claim 15, wherein each input stage includes a transistor and having a control terminal which receives a portion of the input signal.

17. A differential active cascode amplifier circuit according to claim 16, wherein each input stage includes a transistor;
    each active cascode amplifier further having an associated current source which biases the associated input stage and the associated output stage.

18. An active cascode amplifier circuit comprising:
    an active cascode amplifier having an auxiliary amplifier, the auxiliary amplifier having an associated output producing an output amplitude;
    means for limiting the output amplitude of the auxiliary amplifier which becomes active during the slew of the active cascode amplifier.

19. The active cascode amplifier circuit according to claim 18, wherein the means for limiting draws power only when an output signal from the auxiliary amplifier reaches a predetermined level.

20. An active cascode amplifier circuit comprising:
    an active cascode amplifier having an input stage, an output stage and an auxiliary amplifier, the auxiliary amplifier having an associated output;
    an amplitude limiter electrically coupled to the output of the auxiliary amplifier becoming active when the output stage shuts off.

* * * * *